United States Patent
Hong

(10) Patent No.: US 11,688,442 B2
(45) Date of Patent: Jun. 27, 2023

(54) CLOCK SIGNAL PROCESSING CIRCUIT, SEMICONDUCTOR APPARATUS, AND SEMICONDUCTOR SYSTEM

(71) Applicant: SK hynix Inc., Icheon-si (KR)

(72) Inventor: Gi Moon Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/459,704

(22) Filed: Aug. 27, 2021

(65) Prior Publication Data

US 2022/0328081 A1    Oct. 13, 2022

(30) Foreign Application Priority Data

Apr. 7, 2021  (KR) .................... 10-2021-0045215

(51) Int. Cl.
*G11C 7/22*      (2006.01)
*G11C 11/4076*   (2006.01)

(52) U.S. Cl.
CPC .............. *G11C 7/222* (2013.01); *G11C 7/225* (2013.01); *G11C 11/4076* (2013.01)

(58) Field of Classification Search
CPC ...... G11C 7/222; G11C 7/225; G11C 11/4076
USPC ...................................... 365/233.1
See application file for complete search history.

(56) References Cited

U.S. PATENT DOCUMENTS

| | | | |
|---|---|---|---|
| 10,026,461 B2* | 7/2018 | Choi | G11C 7/1087 |
| 11,256,285 B2* | 2/2022 | Seo | H03K 5/135 |
| 2022/0189521 A1* | 6/2022 | Hwang | G11C 7/1012 |

FOREIGN PATENT DOCUMENTS

| | | |
|---|---|---|
| KR | 1020150142852 A | 12/2015 |
| KR | 101883652 B1 | 8/2018 |
| KR | 1020190123315 A | 10/2019 |

* cited by examiner

*Primary Examiner* — Son L Mai
(74) *Attorney, Agent, or Firm* — William Park & Associates Ltd.

(57) ABSTRACT

A clock signal processing circuit includes a clock buffer configured to generate a pair of second clock signals with opposite phases after receiving a pair of first clock signals with opposite phases and configured to fix the second clock signals to determined levels according to a control signal until toggling of the first clock signals begins.

22 Claims, 9 Drawing Sheets

CLOCK SIGNAL PROCESSING CIRCUIT, SEMICONDUCTOR APPARATUS, AND SEMICONDUCTOR SYSTEM

CROSS-REFERENCES TO RELATED APPLICATION

The present application claims priority under 35 U.S.C. § 119(a) to Korean application number 10-2021-0045215, filed on Apr. 7, 2021, in the Korean Intellectual Property Office, which is incorporated herein by reference in its entirety.

BACKGROUND

1. Technical Field

Various embodiments may generally relate to a semiconductor circuit, and more particularly, to a clock signal processing circuit, a semiconductor apparatus, and a semiconductor system.

2. Related Art

Semiconductor apparatuses, for example, semiconductor memory apparatuses may be used in a system form including a controller which performs data transmission and reception in connection with the semiconductor memory apparatuses.

The semiconductor memory apparatuses may use a system clock signal HCK/HCKB and a data clock signal WCK/WCKB with a higher frequency than the system clock signal, which are provided from a controller.

The system clock signal HCK/HCKB may be a clock signal always provided from the controller and the data clock signal WCK/WCKB may be a clock signal that is provided from the controller only when data is written in the semiconductor memory apparatus.

According to operation standards of the semiconductor memory apparatuses, for example, graphic double data rate synchronous dynamic random access memories (GDDR SDRAMs), it may be determined to perform a clock training operation for matching the phases of the system clock signal HCK/HCKB and the data clock signal WCK/WCKB.

SUMMARY

In an embodiment of the present disclosure, a clock signal processing circuit may include a clock buffer configured to generate a pair of second clock signals with opposite phases after receiving a pair of first clock signals with opposite phases and configured to fix the second clock signals to determined levels according to a control signal until toggling of the first clock signals begins.

In an embodiment of the present disclosure, a semiconductor apparatus may include: a training circuit configured to perform a clock training operation only once in an initial power-up process and configured to refrain from performing the clock training operation with respect to a self-refresh exit command and a clock training entry command after the initial power-up process; and a clock signal processing circuit configured to perform a clock buffer control operation that controls an output of a clock buffer, which receives a data clock signal, according to at least one of the self-refresh exit command and the clock training entry command.

In an embodiment of the present disclosure, a semiconductor system may include: a semiconductor apparatus configured to perform a clock training operation only once in an initial power-up process, and perform a clock buffer control operation that controls an output of a clock buffer that is configured to receive a data clock signal according to at least one of a self-refresh exit command and a clock training entry command, other than performing the clock training operation with respect to the self-refresh exit command and the clock training entry command after the initial power-up process; and a controller configured to provide at least one of a system clock signal, the data clock signal, the self-refresh exit command, and the clock training entry command to the semiconductor apparatus and provide the data clock signal with different frequencies in a preliminary section and a main section to the semiconductor apparatus. The controller may provide the data clock signal with a lower frequency in the preliminary section than a target frequency of the main section.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Embodiments are provided to a clock signal processing circuit, a semiconductor apparatus, and a semiconductor system, cable of reducing a time required for clock training.

These and other features, aspects, and embodiments are described in more detail below.

Figure 1:
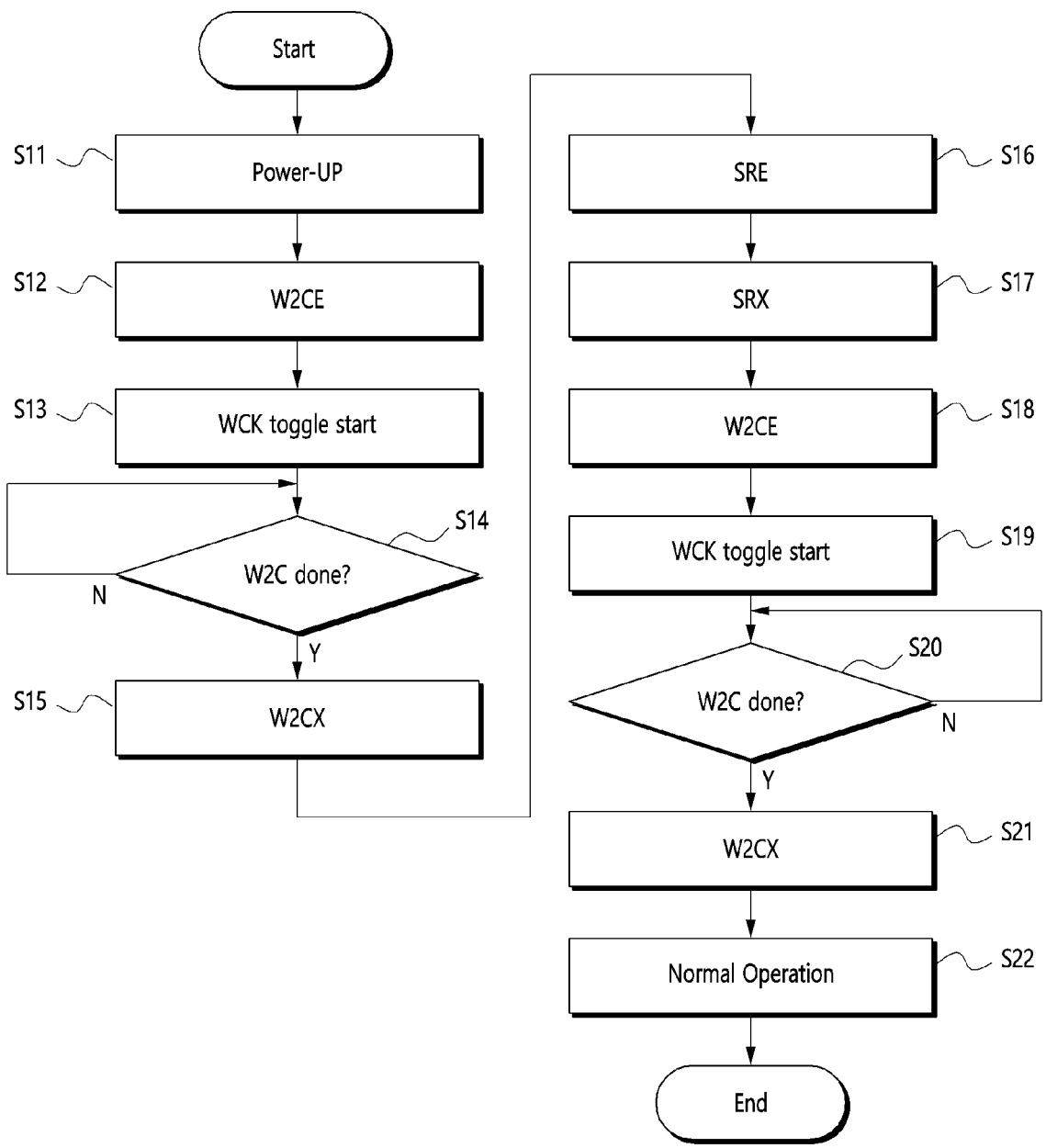
FIG. 1 is a diagram illustrating a conventional clock signal processing method.

FIG. 1 is a diagram illustrating a conventional clock signal processing method.

Referring to FIG. 1, in the power-up of a semiconductor apparatus (S11), a controller may provide a clock training entry command W2CE to the semiconductor apparatus (S12).

The controller may control the semiconductor apparatus to enter a clock training mode according to the clock training entry command W2CE and then toggle a data clock signal WCK/WCKB (S13).

The semiconductor apparatus may perform clock training W2C that matches the phases of a system clock signal HCK/HCKB and the data clock signal WCK/WCKB through an internal training circuit and determines whether or not the phase matching has completed (S14).

In operation S14, the semiconductor apparatus may transfer a clock training result for each stage to the controller, and the semiconductor apparatus may repeatedly perform the next stage of clock training according to a response of the controller.

When it is determined in operation S14 that the clock matching has completed, the semiconductor apparatus may terminate the clock training mode according to a clock training exit command W2CX (S15).

Then, the semiconductor apparatus may enter a self-refresh mode to perform a self-refresh operation according to a self-refresh entry command SRE provided from the controller (S16).

When a fixed time elapses after performing the self-refresh operation in operation S16, the semiconductor apparatus may terminate the self-refresh operation according to a self-refresh exit command SRX (S17).

After terminating the self-refresh operation in operation S17, the semiconductor apparatus may enter the clock training mode according to the clock training entry command W2CE (S18).

The controller may toggle the data clock signal WCK/WCKB (S19) in a state in which the semiconductor apparatus enters into the clock training mode in operation S18.

The semiconductor apparatus may perform the clock training W2C that matches the phases of the system clock signal HCK/HCKB and the data clock signal WCK/WCKB through the internal training circuit and determines whether or not the phase matching has completed (S20).

When it is determined in operation S20 that the phase matching has completed, the semiconductor apparatus may terminate the clock training mode according to the clock training exit command W2CX (S21) and may perform a normal operation (S22).

As described above, in the conventional clock signal processing method, the clock training operation has to be performed in the initial power-up as well as in each self-refresh operation. Since the clock training operation may require processes of transferring a training result for each stage from the semiconductor apparatus to the controller and confirming the training result in the controller and the like, a lot of time may be required, and thus, the time at which the semiconductor apparatus performs the normal operation may be delayed.

Figure 2:
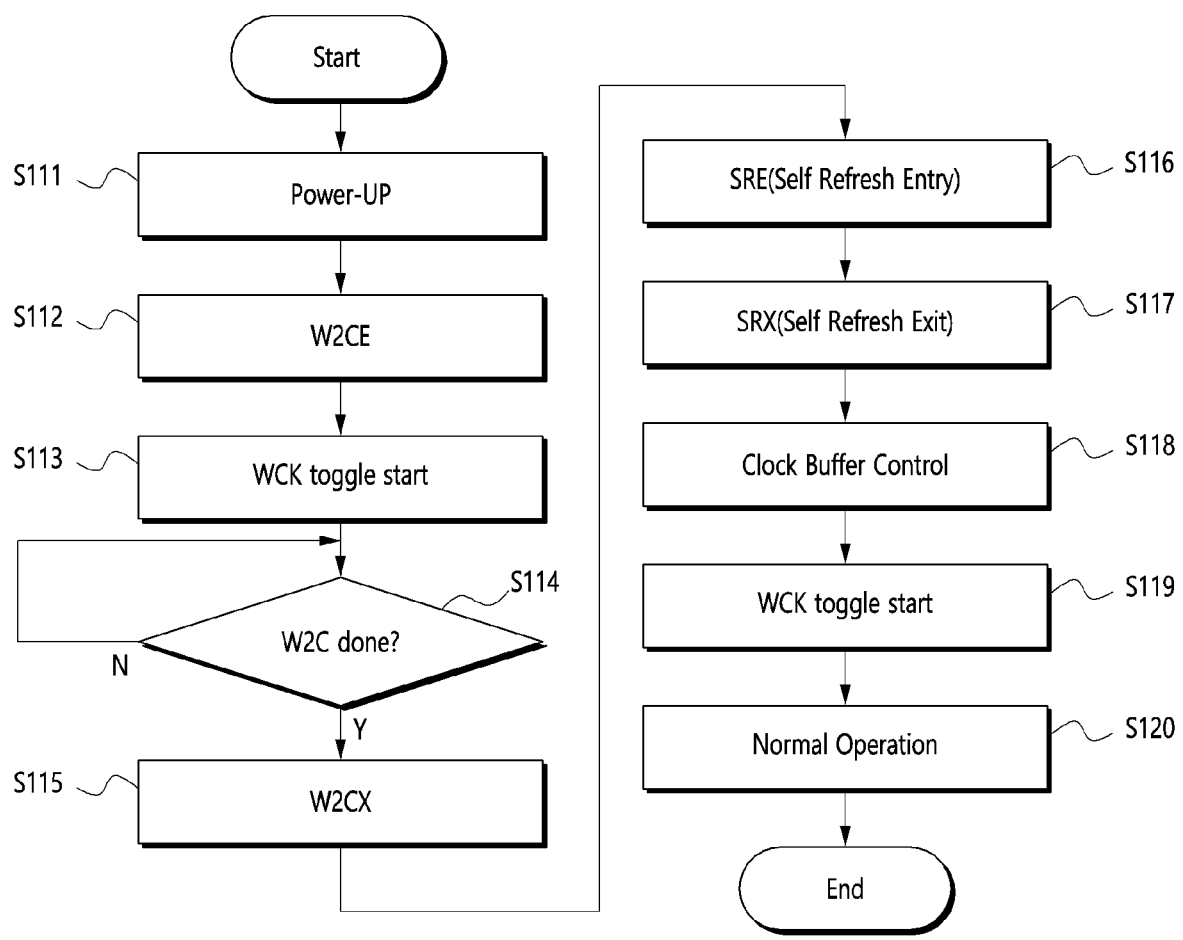
FIG. 2 is a diagram illustrating a clock signal processing method according to an embodiment of the present disclosure.

FIG. 2 is a diagram illustrating a clock signal processing method according to an embodiment of the present disclosure.

The present technology may perform the clock training W2C only once in the initial power-up of a semiconductor apparatus and then may perform an operation, for example, a clock buffer control operation for preventing phase error, which may be caused when the clock training is not performed, after the self-refresh operation, other than the performing of the clock training.

The clock signal processing method according to an embodiment will be described below with reference to FIG. 2.

In the power-up of a semiconductor apparatus (S111), a controller may provide the clock training entry command W2CE to the semiconductor apparatus (S112).

The controller may control the semiconductor apparatus to enter a clock training mode according to the clock training entry command W2CE and then toggle the data clock signal WCK/WCKB (S113).

The example in which the controller performs operation S113 of toggling the data clock signal WCK/WCKB after performing operation S112 of providing the clock training entry command W2CE to the semiconductor apparatus has been illustrated in the embodiment. However, in the present technology, the controller may perform operation S113 of toggling the data clock signal WCK/WCKB and then perform operation S112 of providing the clock training entry command W2CE to the semiconductor apparatus.

The semiconductor apparatus may perform clock training W2C that matches the phases of the system clock signal HCK/HCKB and the data clock signal WCK/WCKB through an internal training circuit and determine whether or not the phase matching has completed (S114).

In operation S114, the semiconductor apparatus may transfer a clock training result for each stage to the controller and may determine whether or not the phase matching has completed according to a response of the controller based on the transferred clock training result.

When it is determined in operation S114 that the phase matching has completed, the semiconductor apparatus may terminate the clock training mode according to the clock training exit command W2CX (S115).

Before or/and after operations S112 to S115 are performed, at least one of the other training (for example, read training, command training) may be performed and then a normal operation may be performed.

Hereinafter, the clock training that is performed by the clock training entry command W2CE and the clock training exit command W2CX after the initial power-up may be referred to as real training, and a section from the clock training entry command W2CE to the clock training exit command W2CX after the initial power-up may be referred to as a real training section. The real training section may be varied according to the phase difference between the system clock signal HCK/HCKB and the data clock signal WCK/WCKB.

The phases of the system clock signal HCK/HCKB and the data clock signal WCK/WCKB may match through the real training, and the controller may store information that is related to the phase matching. Accordingly, the controller may provide the system clock signal HCK/HCKB and the data clock signal WCK/WCKB, of which the phases match with each other, to the semiconductor apparatus after the real training.

Then, the semiconductor apparatus may enter the self-refresh mode according to the self-refresh entry command SRE provided from the controller to perform the self-refresh operation (S116).

After performing the self-refresh operation in operation S116, the semiconductor apparatus may terminate the self-refresh operation according to the self-refresh exit command SRX (S117).

After the self-refresh operation is terminated, the semiconductor apparatus might not perform the clock training and may perform a clock buffer control operation that is capable of preventing a phase error that may occur when the clock training is not performed (S118).

The clock buffer control operation may include an operation that fixes an output of a clock buffer, which receives the data clock signal WCK/WCKB, to a determined level to prevent the oscillation of divided clocks, into which the data clock signal WCK/WCKB is divided, output from the semiconductor apparatus, until toggling of the data clock signal WCK/WCKB begins.

The clock buffer control operation may be performed according to at least one of the self-refresh exit command SRX, the clock training entry command W2CE, and the clock training exit command W2CX.

The section from the clock training entry command W2CE to the clock training exit command W2CX after the self-refresh exit command SRX may be referred to as a pseudo training section.

As described above, in the present technology, the phase matching of the system clock signal HCK/HCKB and the data clock signal WCK/WCKB has been completed through the real training in operations S112 to S115. Accordingly, the phase matching state of divided clock signals, which are generated according to the output of the clock buffer inside the semiconductor apparatus, and the data clock signal WCK/WCKB may be maintained through the clock buffer control operation without performing of the clock training again.

The controller may toggle the data clock signal WCK/WCKB after the self-refresh exit command SRX or the clock training entry command W2CE (S119).

It has been illustrated in the embodiment that operation S119 of toggling the data clock signal WCK/WCKB is performed after the training entry command W2CE, but the training entry command W2CE may be provided to the semiconductor apparatus after the toggling the data clock signal WCK/WCKB.

The semiconductor apparatus may directly perform the normal operation without a wait time, for example, a wait time for the clock training, after the toggling of the data clock signal WCK/WCKB (S120).

Figure 3:
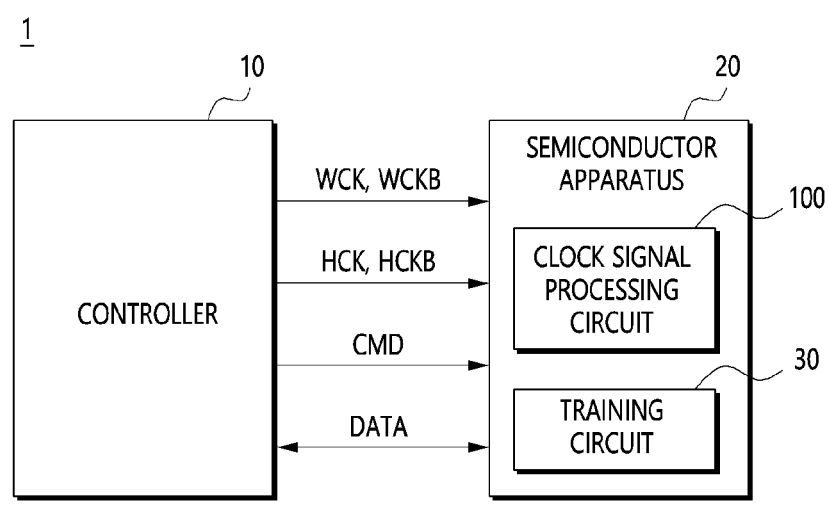
FIG. 3 is a diagram illustrating a configuration of a semiconductor system according to an embodiment of the present disclosure.

FIG. 3 is a diagram illustrating a configuration of a semiconductor system 1 according to an embodiment.

Referring to FIG. 3, the semiconductor system 1 may include a controller 10 and a semiconductor apparatus 20.

The controller 10 may be a graphic processing unit (GPU) or a central processing unit (CPU).

The controller 10 may provide the data clock signal WCK/WCKB, the system clock signal HCK/HCKB, and a command signal CMD to the semiconductor apparatus 20.

The data clock signal WCK/WCKB and the system clock signal HCK/HCKB may have different periods or/and frequencies from each other.

The controller 10 may provide the data clock signal WCK/WCKB to the semiconductor apparatus 20 when data DATA is written.

The controller 10 may receive data DATA output from the semiconductor apparatus 20 according to a read command.

The controller 10 may determine whether or not the clock training has completed according to the clock training result for each stage that is provided from the semiconductor apparatus 20.

The command signal CMD may include at least one of the self-refresh entry command SRE, the self-refresh exit command SRX, the clock training entry command W2CE, and the clock training exit command W2CX.

The semiconductor apparatus 20 may include a training circuit 30 and a clock signal processing circuit 100.

The training circuit 30 may perform clock training W2C that matches the phases of the system clock signal HCK/HCKB and the data clock signal WCK/WCKB according to semiconductor apparatus 20. The semiconductor apparatus 20 may be a volatile memory device, a nonvolatile memory device, or a combined memory device of the nonvolatile memory device and the volatile memory device.

The semiconductor apparatus 20 may include a semiconductor memory apparatus, for example, a graphic double data rate synchronous dynamic random access memory (GDDR SDRAM), that the operation standards have determined to perform the clock training after the self-refresh operation.

The semiconductor apparatus 20 may be configured to perform the real training (for example, the clock training) only once in the initial power-up process and configured to not perform the clock training with respect to the self-refresh exit command SRX and the clock training entry command W2CE after the initial power-up process.

The clock signal processing circuit 100 of the semiconductor apparatus 20 may perform the clock buffer control operation according to the clock training entry command W2CE and the clock training exit command W2CX.

The clock buffer control operation may include an operation that fixes an output of a clock buffer in the clock signal processing circuit 100, which receives the data clock signal WCK/WCKB, to a determined level until the toggling of the data clock signal WCK/WCKB begins.

Figure 4:
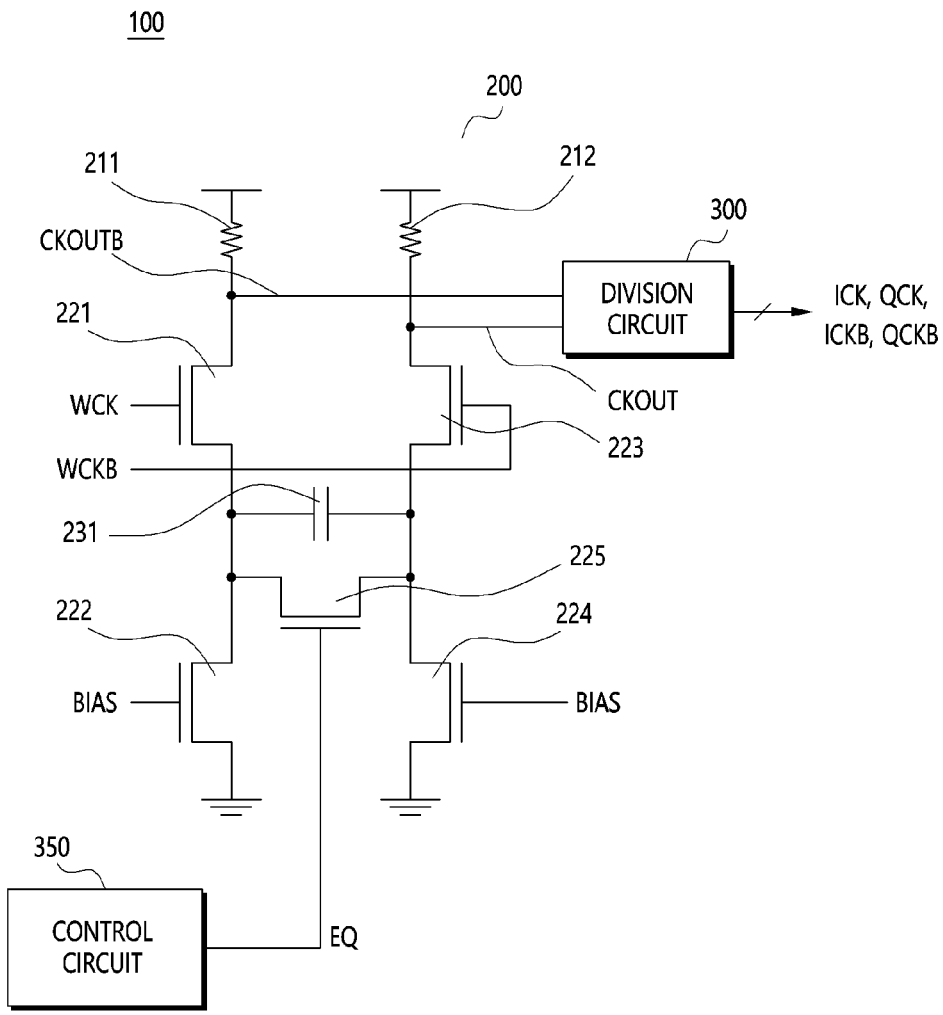
FIG. 4 is a diagram illustrating a configuration of a clock signal processing circuit according to an embodiment of the present disclosure.

FIG. 4 is a diagram illustrating a configuration of the clock signal processing circuit 100 according to an embodiment.

Referring to FIG. 4, the clock signal processing circuit 100 may include a clock buffer 200, a division circuit 300, and a control circuit 350.

The clock buffer 200 may generate a second clock signal by receiving a first clock signal. The clock buffer 200 may buffer the received first clock signal and output the buffered first clock signal as the second clock signal.

The division circuit 300 may generate a third clock signal according to the second clock signal. The division circuit 300 may divide the buffered first clock signal as the second clock signal, which is output from the clock buffer 200, to output divided signals as the third clock signal.

The first clock signal may be the data clock signals WCK and WCKB, the second clock signal may be output signals CKOUT and CKOUTB of the clock buffer 200, and the third clock signal may be a plurality of multi-phase divided signals ICK, QCK, ICKB, and QCKB. Here, the data clock signals WCK and WCKB may be signals with opposite phases, and the output signals CKOUT and CKOUTB of the clock buffer 200 may be signals with opposite phases. The multi-phase divided signals ICK and ICKB into which the output signal CKOUT is divided may be signals with opposite phases. The multi-phase divided signals QCK and QCKB into which the output signal CKOUTB is divided may be signals with opposite phases.

The clock buffer 200 may receive and buffer the data clock signals WCK and WCKB and output the buffered data clock signals as the output signals CKOUTB and CKOUT.

The clock buffer 200 may fix the output signals CKOUT and CKOUTB to determined levels according to a control signal EQ through the clock buffer control operation until the toggling of the data clock signals WCK and WCKB begins.

The control circuit 350 may generate the control signal EQ according to at least one of the clock training entry command W2CE and the clock training exit command W2CX. The control signal EQ may be transited to a high level based on the clock training entry command W2CE and may be transited to a low level based on the clock training exit command W2CX.

The clock buffer 200 may include a first current path circuit, a second current path circuit, and an equalization circuit.

The first current path circuit may form a first current path between a power supply terminal and a ground terminal to generate one of the two, for example, an inverted output signal CKOUTB of the output signals CKOUT and CKOUTB according to one of the two, for example, a non-inverted data clock signal WCK of the data clock signals WCK and WCKB.

The second current path circuit may form a second current path between the power supply terminal and the ground terminal to generate the other one of the two, for example, a non-inverted output signal CKOUT of the output signals CKOUT and CKOUTB according to the other one of the two, for example, an inverted data clock signal WCKB of the data clock signals WCK and WCKB.

The equalization circuit may fix the output signals CKOUT and CKOUB to the determined levels by equalizing the first current path of the first current path circuit and the second current path of the second current path circuit according to the control signal EQ.

The clock buffer 200 may include first and second resistors 211 and 212, first to fifth switches 221 to 225, and a capacitor 231.

The first resistor 211 and the first and second switches 221 and 222 may constitute the first current path circuit.

The second resistor 212 and the third and fourth switches 223 and 224 may constitute the second current path circuit.

The fifth switch 225 and the capacitor 231 may constitute the equalization circuit.

One terminal of the first resistor 211 may be coupled to the power supply terminal.

One terminal of the second resistor 212 may be coupled to the power supply terminal.

The first and second switches 221 and 222 may be coupled in series between the other terminal of the first resistor 211 and a ground terminal to form the first current path.

The first switch 221 may be controlled according to one of the two, for example, WCK of the data clock signals WCK and WCKB as input signals.

The first current path circuit may output one of the two, for example, CKOUTB of the output signals CKOUT and CKOUTB through a node to which the first resistor 211 and the first switch 221 are coupled.

The second switch 222 may be controlled according to a bias voltage BIAS.

The third and fourth switches 223 and 224 may be coupled in series between the other terminal of the second resistor 212 and the ground terminal to form the second current path.

The third switch 223 may be controlled according to the other one of the two, for example, WCKB of the data clock signals WCK and WCKB.

The second current path circuit may output the other one of the two, for example, CKOUT of the output signals CKOUT and CKOUTB through a node to which the second resistor 212 and the third switch 223 are coupled.

The fourth switch 224 may be controlled according to the bias voltage BIAS.

The fifth switch 225 may be coupled between the first current path and the second current path.

The fifth switch 225 may be controlled according to the control signal EQ.

The fifth switch 225 may equalize the voltage levels of both terminals when the control signal EQ is transited to a high level.

For example, the first to fifth switches 221 to 225 may be configured of NMOS transistors.

The capacitor 231 may be coupled to the fifth switch 225 in parallel between the first current path and the second current path.

The division circuit 300 may generate the plurality of multiphase divided signals ICK, QCK, ICKB, and QCKB by dividing the output signals CKOUT and CKOUTB of the clock buffer 200.

The control circuit 350 may generate the control signal EQ according to the clock training entry command W2CE and the clock training exit command W2CX.

Figure 5:
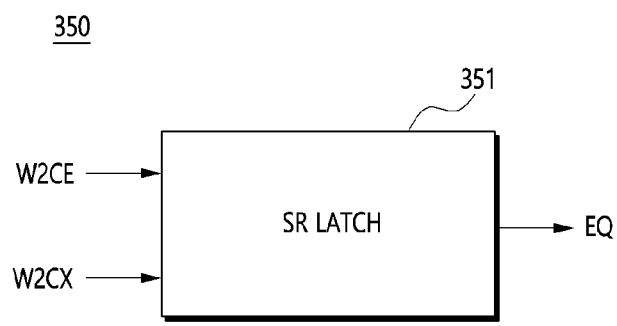
FIG. 5 is a diagram illustrating a configuration of a control circuit of FIG. 4.

FIG. 5 is a diagram illustrating a configuration of the control circuit 350 of FIG. 4.

Referring to FIG. 4, the control circuit 350 may include a SR latch 351.

The SR latch 351 may generate the control signal EQ that is transited to the high level when the clock training entry command W2CE is input and is transited to a low level when the clock training exit command W2CX is input.

Figure 6:
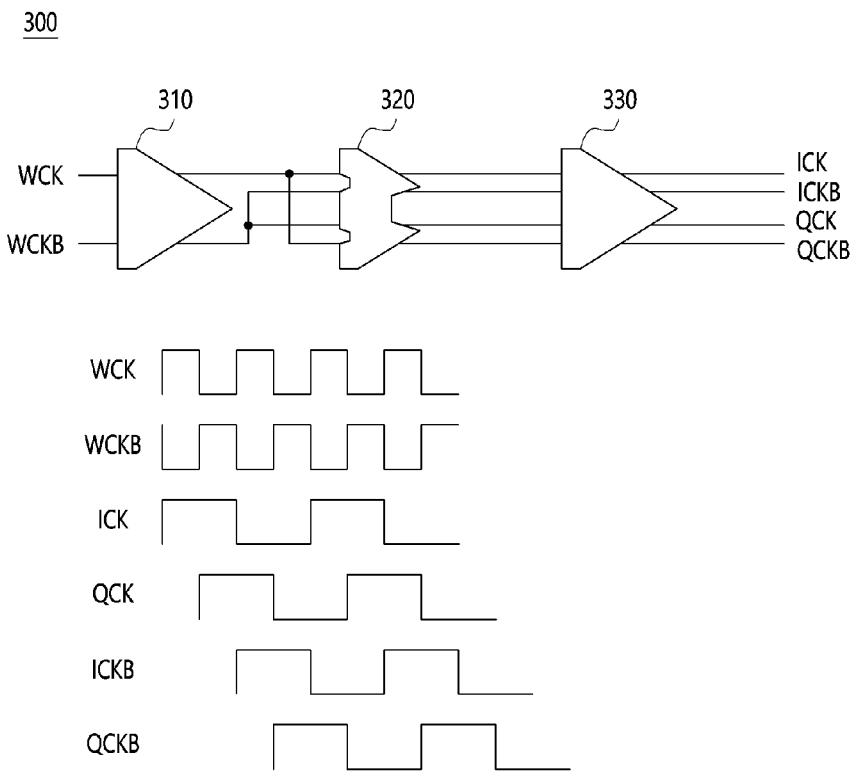
FIG. 6 is a diagram illustrating a configuration of a division circuit of FIG. 4.

FIG. 6 is a diagram illustrating a configuration of the division circuit 300 of FIG. 4.

Referring to FIG. 6, the division circuit 300 may include a first buffer 310, a divider 320, and a second buffer 330.

The first buffer 310 may buffer the output signals CKOUT and CKOUTB of the clock buffer 200, which are the data clock signals WCK and WCKB that are buffered in the clock buffer 200, and may output the buffered output signals.

The divider 320 may divide output signals of the first buffer 310 (for example, by 2) and output divided signals.

The second buffer 330 may buffer output signals of the divider 320 and output the buffered output signals as the plurality of multiphase divided signals ICK, QCK, ICKB, and QCKB.

Figure 7:
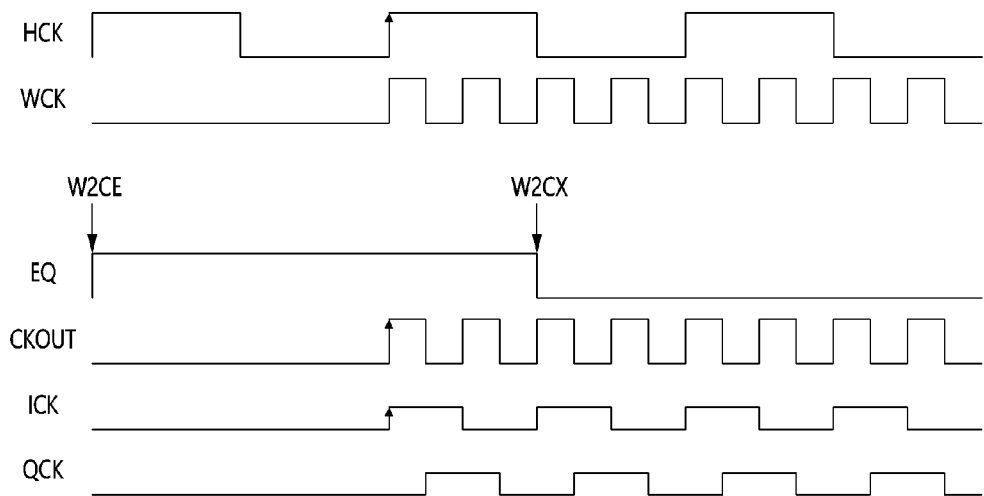
FIG. 7 is a diagram illustrating operation timing of a clock signal processing circuit according to an embodiment of the present disclosure.

FIG. 7 is a diagram illustrating operation timing of the clock signal processing circuit 100 according to an embodiment.

The semiconductor apparatus 20 may generate the control signal EQ according to the clock training entry command W2CE and the clock training exit command W2CX after the self-refresh exit command SRX.

The control signal EQ may be transited to the high level according to the clock training entry command W2CE and may be transited to the low level according to the clock training exit command W2CX.

The clock training exit command W2CX may be generated in the real training after toggling of the data clock signal WCK, and thus, the high level section of the control signal EQ may also be maintained even after the toggling of the data clock signal WCK.

Until the data clock signal WCK is input, for example, until the toggling of the data clock signal WCK begins, the oscillation of the output signals of the division circuit 300 (for example, the plurality of multiphase divided signals ICK, QCK, ICKB, and QCKB) has to be prevented. When the plurality of multiphase divided signals ICK, QCK, ICKB, and QCKB oscillate before the toggling of the data clock signal WCK begins, the phase error, in which the phases of the plurality of multiphase divided signals ICK, QCK, ICKN, and QCKB mismatch with the phases of the data clock signals WCK and WCKB, may be caused.

According to the embodiment, the high level section of the control signal EQ may be controlled according to the clock training entry command W2CE and the clock training exit command W2CX, and thus, the output signals CKOUT and CKOUTB of the clock buffer 200 may be fixed to the low level and high level. Accordingly, the oscillation of the output signals of the division circuit 300 before the toggling of the data clock signal WCK may be prevented. Since the oscillation of the output signal of the division circuit 300 is prevented until the toggling of the data clock signals WCK and WCKB begins, the phases of the plurality of multiphase divided signals ICK, QCK, ICKB, and QCKB, which are generated based on the data clock signals WCK and WCKB, may match with the phases of the system clock signals HCK and HCKB even without the real training after the self-refresh operation is terminated.

Figure 8:
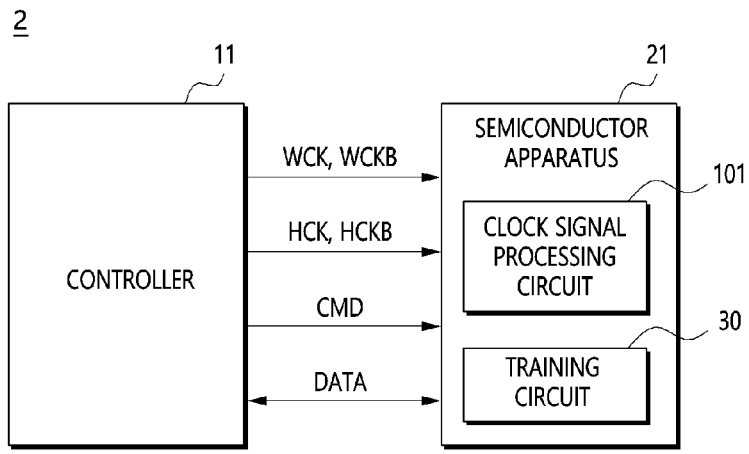
FIG. 8 is a diagram illustrating a configuration of a semiconductor system according to another embodiment of the present disclosure.

FIG. 8 is a diagram illustrating a configuration of a semiconductor system 2 according to another embodiment.

Referring to FIG. 8, the semiconductor system 2 may include a controller 11 and a semiconductor apparatus 21.

The controller 11 may provide the data clock signals WCK and WCKB, the system clock signals HCK and HCKB, and the command signal CMD to the semiconductor apparatus 21.

The controller 11 may provide the data clock signals WCK and WCKB to the semiconductor apparatus 21 when data DATA is written.

The controller 11 may receive data DATA that is output from the semiconductor apparatus 21 according to a read command.

The command signal CMD may include at least one of the self-refresh entry command SRE, the self-refresh exit command SRX, the clock training entry command W2CE, and the clock training exit command W2CX. The semiconductor apparatus 21 may include a training circuit 30 and a clock signal processing circuit 101.

The training circuit 30 may perform clock training W2C that matches the phases of the system clock signals HCK and HCKB with the phases of the data clock signals WCK and WCKB according to the semiconductor apparatus 21.

The semiconductor apparatus 21 may be a volatile memory device, a nonvolatile memory device, or a combined memory device of the nonvolatile memory device and the volatile memory device.

The semiconductor apparatus 21 may include a semiconductor memory apparatus, for example, a graphic double data rate synchronous dynamic random access memory (GDDR SDRAM), that the operation standards have determined to perform the clock training after the self-refresh operation.

The semiconductor apparatus 21 may be configured to perform the real training, for example, the clock training, only once in the initial power-up process and not to perform the clock training with respect to the self-refresh exit command SRX and the clock training entry command W2CE after the initial power-up process.

The clock signal processing circuit 101 of the semiconductor apparatus 21 may perform the clock buffer control operation according to at least one of the clock training entry command W2CE and the self-refresh exit command SRX, and any one of the data clock signals WCK and WCKB.

The clock buffer control operation may include an operation that fixes the output signals of the clock buffer 200, which receives the data clock signals WCK and WCKB, to the determined levels and prevents oscillation of divided clocks, into which the output signals CKOUT/CKOUTB of the output buffer 200 are divided, output from the semiconductor apparatus 21, until the toggling of the data clock signals WCK and WCKB begins.

Figure 9:
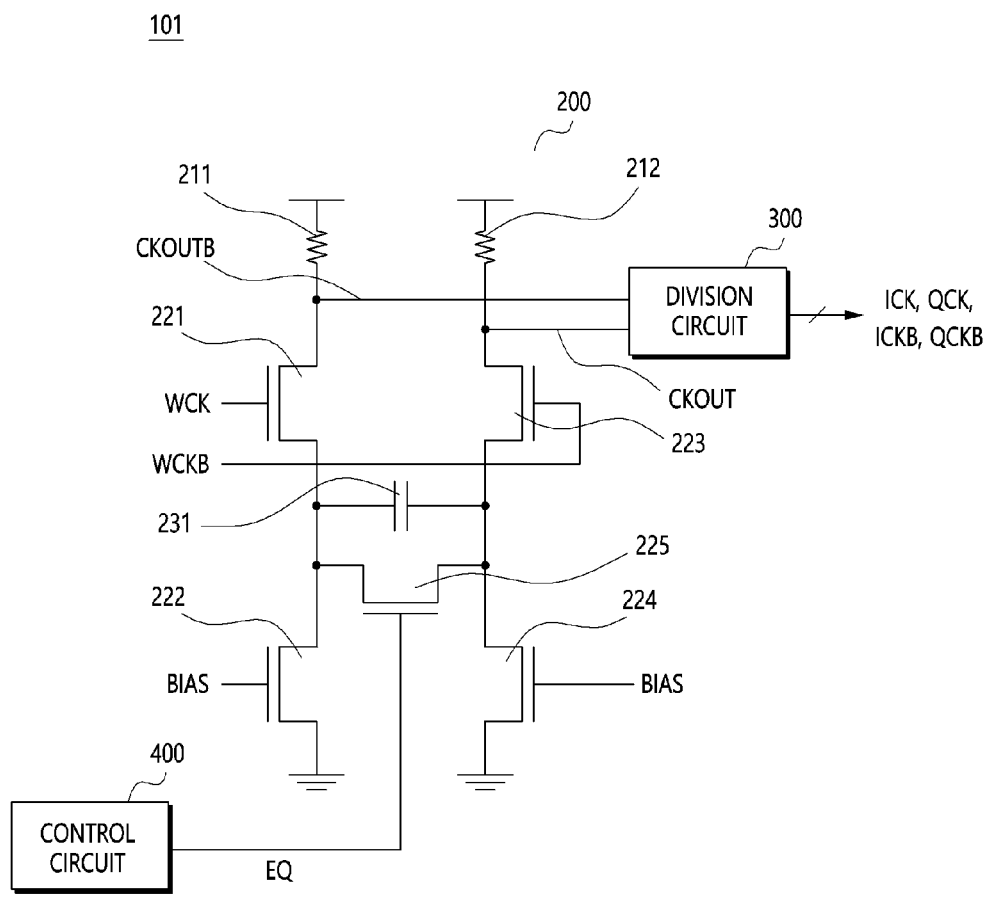
FIG. 9 is a diagram illustrating a configuration of a clock signal processing circuit according to another embodiment of the present disclosure.

FIG. 9 is a diagram illustrating a configuration of the clock signal processing circuit 101 according to another embodiment.

Referring to FIG. 9, the clock signal processing circuit 101 according to another embodiment may include a clock buffer 200, a division circuit 300, and a control circuit 400.

The clock buffer 200 may receive and buffer the data clock signals WCK and WCKB and may output the buffered data clock signals as the output signals CKOUTB and CKOUT.

The clock buffer 200 may fix the output signals CKOUT and CKOUTB to the determined levels through the clock buffer control operation according to the control signal EQ until the toggling of the data clock signals WCK and WCKB begins.

The division circuit 300 may generate the plurality of multiphase divided signals ICK, QCK, ICKB, and QCKB by dividing the output signals CKOUT and CKOUTB of the clock buffer 200 that the data clock signals WCK and WCKB are buffered.

The clock buffer 200 may have the same configuration as the clock buffer circuit 200 of FIG. 4, and the division circuit 300 may have the same configuration as the division circuit 300 of FIG. 6.

The control circuit 400 may generate the control signal EQ based on at least one of the self-refresh exit command SRX and the clock training entry command W2CE, and at least one of the data clock signals WCK and WCKB and at least one of pair of output signals CKOUT and CKOUTB of the clock buffer 200. For example, the control circuit 400 may generate the control signal EQ that is transited to the high level based on the at least one of the self-refresh exit command SRX and the clock training entry command W2CE and transited to the low level based on any one of the data clock signals WCK and WCKB, for example, the non-inverted data clock signal WCK. In another example, the control circuit 400 may generate the control signal EQ that is transited to the high level based on the at least one of the self-refresh exit command SRX and the clock training entry command W2CE and transited to the low level based on one of the two, for example, the non-inverted output signal CKOUT of the pair of output signals CKOUT and CKOUTB of the clock buffer 200 that the data clock signals WCKB and WCK are buffered.

Figure 10:
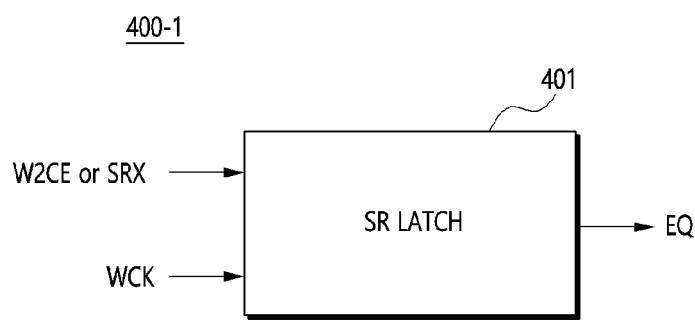
FIG. 10 is a diagram illustrating a configuration of an example of a control circuit of FIG. 9.
Figure 11:
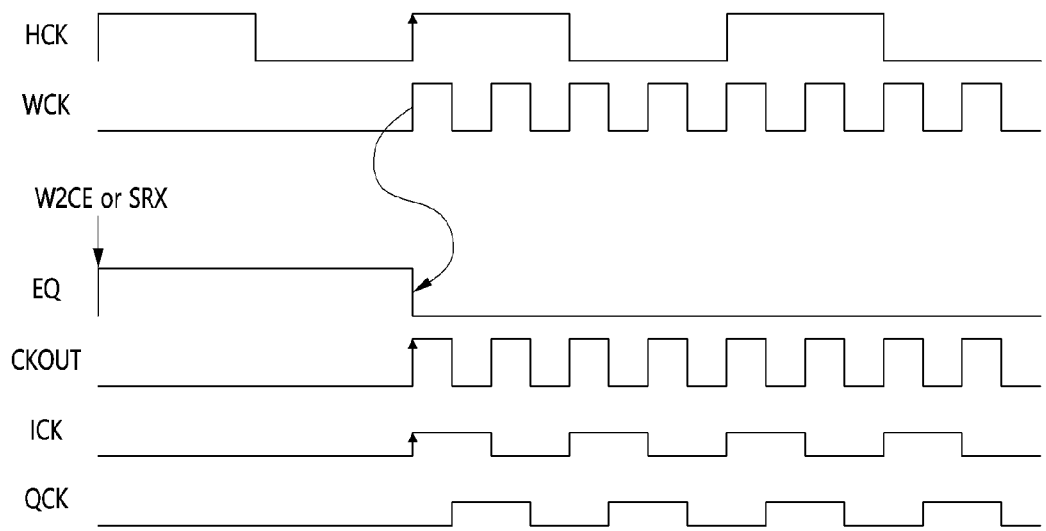
FIG. 11 is a diagram illustrating operation timing of a clock signal processing circuit including the control circuit of FIG. 10.

FIG. 10 is a diagram illustrating a configuration of a control circuit 400-1 as an example of the control circuit 400 of FIG. 9, and FIG. 11 is a diagram illustrating operation timing of the clock signal processing circuit 101 including the control circuit 400-1 of FIG. 10.

Referring to FIGS. 10 and 11, the control circuit 400-1 may generate the control signal EQ according to at least one of the self-refresh exit command SRX and clock training entry command W2CE, and the data clock signal WCK.

The control circuit 400-1 may include a SR latch 401.

The SR latch 401 may allow the control signal EQ to be transited to the high level when the self-refresh exit command SRX or the clock training entry command W2CE is input and allow the control signal EQ to be transited to the low level at a rising edge of the data clock signal WCK.

The output signals CKOUT and CKOUTB of the clock buffer 200 may be fixed to the low level and the high level as the control signal EQ is transited to the high level, and thus, the oscillation of the output signal of the division circuit 300 may be prevented.

Since the oscillation of the output signal of the division circuit 300 is prevented until the toggling of the data clock signals WCK and WCKB begins, the phases of the plurality of multiphase divided signals ICK, QCK, ICKB, and QCKB that are generated in the division circuit 300 based on the data clock signals WCK and WCKB may match with the phases of the system clock signals HCK and HCKB even without performing the real training again after the self-refresh exit command SRX.

Figure 12:
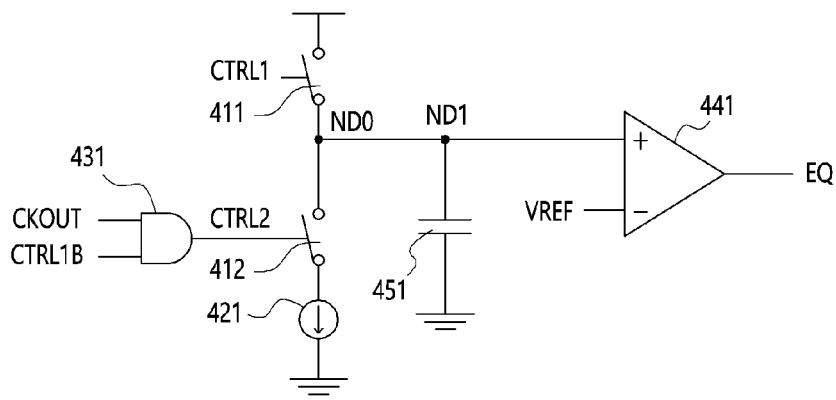
FIG. 12 is a diagram illustrating a configuration of another example of a control circuit of FIG. 9.

FIG. 12 is a diagram illustrating a configuration of a control circuit 400-2 as another example of the control circuit 400 of FIG. 9.

Referring to FIG. 12, the control circuit 400-2 may generate the control signal EQ according to at least one of the self-refresh exit command SRX and the clock training entry command W2CE, and any one of the output signals CKOUT and CKOUTB of the clock buffer 200. For example, the control circuit 400-2 may generate the control signal EQ according to a first preliminary control signal CTRL1 that is generated based on the at least one of the self-refresh exit command SRX and the clock training entry command W2CE, an inverted first preliminary control signal CRTL1B, and the output signal CKOUT of the clock buffer 200 that the data clock signal WCKB is buffered. Specifically, the control circuit 400-2 may generate the control signal EQ that is transited to the high level based on the first preliminary control signal CTRL1 and transited to the low level based on the inverted first preliminary control signal CRTL1B and the output signal CKOUT of the clock buffer 200.

The control circuit 400-2 may include first and second switches 411 and 412, a current source 421, a logic gate 431, a comparator 441, and a capacitor 451.

One terminal of the first switch 411 may be coupled to a power terminal, and the other terminal of the first switch 411 may be coupled to a first node ND0.

The first switch 411 may be controlled according to the first preliminary control signal CTRL1.

The first preliminary control signal CTRL1 may be a one pulse type signal that is generated according to the self-refresh exit command SRX or the clock training entry command W2CE.

One terminal of the second switch 412 may be coupled to the first node ND0 and the other terminal of the second switch 412 may be coupled to a ground terminal through the current source 421.

The second switch 412 may be controlled according to a second preliminary control signal CTRL2.

The logic gate 431 may perform a logic AND operation on the inverted first preliminary control signal CTRL1B and the output signal CKOUT of the clock buffer 200 and may output a logic AND operation result as the second preliminary control signal CTRL2.

The comparator 441 may compare a voltage level of a first input terminal (+) and a reference voltage VREF input to a second input terminal (−) and may output a comparison result as the control signal EQ.

The capacitor 451 may be coupled between a second node ND1, coupled between the first node ND0 and the first input terminal (+) of the comparator 441, and the ground terminal.

The first switch 411 may turn on according to the one pulse type first preliminary control signal CTRL 1, and the capacitor 451 may be charged. Thus, the voltage level of the second node ND1 may be raised.

As the voltage level of the second node ND1 is increased to be greater than the voltage level of the reference voltage VREF, the comparator 441 may output the control signal EQ with the high level.

When the first preliminary control signal CTRL1 is transited to the low level, the first switch 411 may turn off, and as the inverted first preliminary control signal CTRL1B is transited to the high level, the second switch 412 may turn on according to the output signal CKOUT as the second preliminary control signal CTRL2.

The capacitor 451 may be discharged during a turn-on section of the second switch 412, and the voltage level of the second node ND1 may be lowered.

As the voltage level of the second node ND1 is lowered to be less than the voltage level of the reference voltage VREF, the comparator 441 may output the control signal EQ with the low level.

Figure 13:
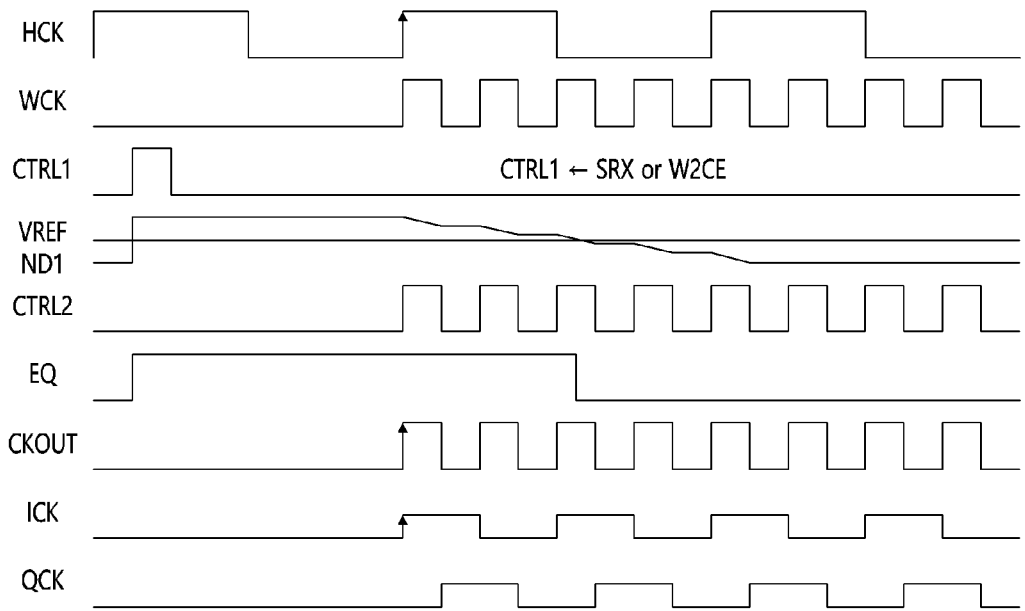
FIG. 13 is a diagram illustrating operation timing of a clock signal processing circuit including the control circuit of FIG. 12.

FIG. 13 is a diagram illustrating operation timing of the clock signal processing circuit 101 including the control circuit 400-2 of FIG. 12.

The semiconductor apparatus 21 may generate the one pulse type of first preliminary control signal CTRL1 according to the self-refresh exit command SRX or the clock training entry command W2CE after the self-refresh exit command SRX.

As described above with reference to FIG. 12, the clock signal processing circuit 101 may raise the voltage level of the second node ND1 according to the first preliminary control signal CTRL1 to allow the control signal EQ to be transited to the high level and may lower the voltage level of the second node ND1 according to the second preliminary control signal CTRL2 to allow the control signal EQ to be transited to the low level.

The clock signal processing circuit 101 may fix the output signals CKOUT and CKOUTB of the clock buffer 200 to the low level and the high level according to the control signal EQ with the high level and prevent the oscillation of the output signal of the division circuit 300, until the toggling of the data clock signal WCK begins.

Until the toggling of the data clock signals WCK and WCKB begins, the clock signal processing circuit 101 may prevent the oscillation of the output signal of the division circuit 300, thereby matching the phases of the plurality of multiphase divided signals ICK, QCK, ICKB, and QCKB that are generated based on the data clock signals WCK and WCKB in the division circuit 300 with the phases of the system clock signals HCK and HCKB even without the real training after the self-refresh exit command SRX.

Figure 14:
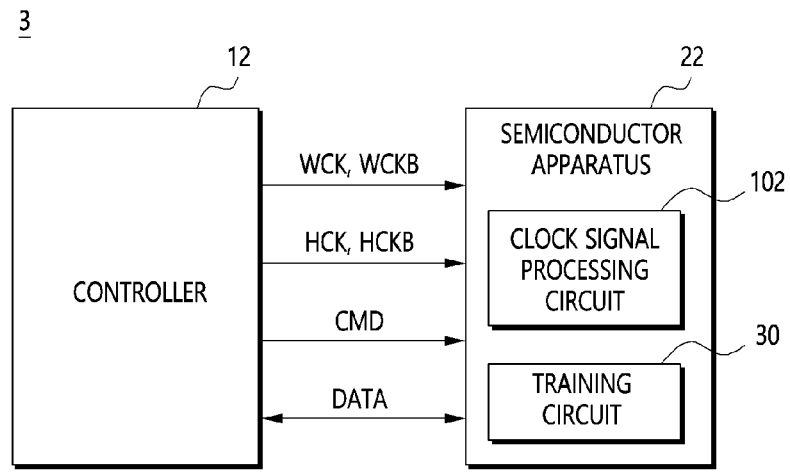
FIG. 14 is a diagram illustrating a configuration of a semiconductor system according to another embodiment of the present disclosure.
Figure 15:
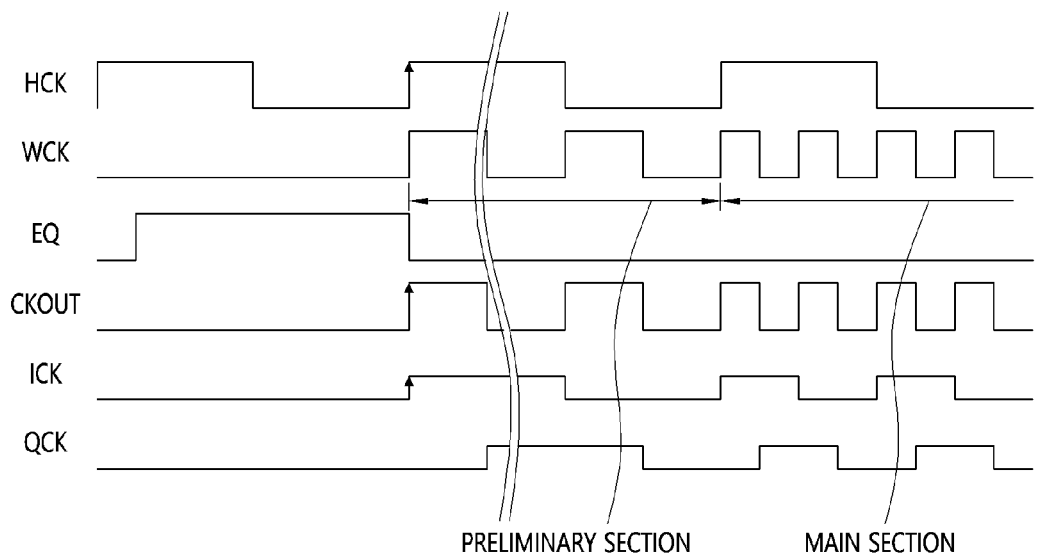
FIG. 15 is a diagram illustrating operation timing of a clock signal processing circuit according to other embodiment of the present disclosure.

FIG. 14 is a diagram illustrating a configuration of a semiconductor system 3 according to another embodiment, and FIG. 15 is a diagram illustrating operation timing of a clock signal processing circuit 102 including the control circuit 400-1 of FIG. 10 according to another embodiment. However, the clock signal processing circuit 102 may include the control circuit 400-2 of FIG. 12.

Referring to FIGS. 14 and 15, the semiconductor system 3 according to another embodiment may include a controller 12 and a semiconductor apparatus 22.

The controller 12 may provide the data clock signals WCK and WCKB, the system clock signals HCK and HCKB, and the command signal CMD to the semiconductor apparatus 22.

The controller 12 may provide the data clock signals WCK and WCKB to the semiconductor apparatus 22 when data DATA is written.

The controller 12 may receive data DATA that is output from the semiconductor apparatus 22 according to a read command.

The command signal CMD may include at least one of the self-refresh entry command SRE, the self-refresh exit command SRX, the clock training entry command W2CE, and the clock training exit command W2CX.

The controller 12 may provide the data clock signals WCK and WCKB with different frequencies in a preliminary section and a main section to the semiconductor apparatus 22.

For example, the controller 12 may provide the data clock signals WCK and WCKB with a lower frequency in the preliminary section than a target frequency of the main section. For example, the controller 12 may provide the data clock signals WCK and WCKB with ½ frequency of the target frequency to the semiconductor apparatus 22 in the preliminary section in a preamble manner.

The semiconductor apparatus 22 may include a training circuit 30 and the clock signal processing circuit 102.

The training circuit 30 may perform clock training W2C that matches the phases of the system clock signals HCK and HCKB with the phases of the data clock signals WCK and WCKB according to the semiconductor apparatus 22.

The semiconductor apparatus 22 may be a volatile memory device, a nonvolatile memory device, or a combined memory device of the nonvolatile memory device and the volatile memory device.

The semiconductor apparatus 22 may include a semiconductor memory apparatus, for example, a graphic double data rate synchronous dynamic random access memory (GDDR SDRAM), that the operation specifications have determined to perform the clock training after the self-refresh operation.

The semiconductor apparatus 22 may be configured to perform the clock training only once in the real training, for example, the initial power-up process, and configured to not perform the clock training with respect to the self-refresh exit command SRX and the clock training entry command W2CE after the initial power-up process.

The clock signal processing circuit 102 of the semiconductor apparatus 22 may perform the clock buffer control operation according to at least one of the self-refresh exit command SRX and the clock training entry command W2CE, and any one of the data clock signals WCK and WCKB.

The clock buffer control operation may include an operation that fixes the output signals of the clock buffer 200, which receives the data clock signals WCK and WCKB, to the determined levels and prevents the oscillation of the multiphase divided signals ICK, QCK, ICKB, and QCKB that are output from the clock signal processing circuit 102, until the toggling of the data clock signal WCK/WCKB begins.

The clock buffer control circuit 102 in the semiconductor apparatus 22 may generate the control signal EQ that is transited to the high level according to the self-refresh exit command SRX or the clock training entry command W2CE after the self-refresh exit command SRX and transited to the low level at a rising edge of the data clock signal WCK.

The semiconductor apparatus 22 may fix the output signals CKOUT and CKOUTB of the clock buffer 200 to the low level and the high level as the control signal EQ is transited to the high level, and thus, the oscillation of the output signal of the division circuit 300 may be prevented until the toggling of the data clock signals WCK and WCKB begins.

Since the semiconductor apparatus 22 may prevent the oscillation of the output signal of the division circuit 300 until the toggling of the data clock signals WCK and WCKB begins, the semiconductor apparatus 22 may match the phases of the plurality of multiphase divided signals ICK, QCK, ICKB, and QCKB that are generated based on the data clock signals WCK and WCKB with the phases of the system clock signals HCK and HCKB even without the real training after the self-refresh operation has completed.

Further, the semiconductor apparatus 22 may perform a clock signal processing operation, which generates the plurality of multiphase divided signals phase-matching with the system clock signals through the clock signal processing circuit 102, by dividing a clock signal processing section into the preliminary section and the main section. The controller 12 may provide the data clock signals WCK and WCKB with the lower frequency in the preliminary section than the target frequency of the main section to the semiconductor apparatus 22, and the semiconductor apparatus 22 may preliminarily match the phases of the plurality of multiphase divided signals ICK, QCK, ICKB, and QCKB that are generated based on the data clock signals WCK and WCKB with the low frequency (a ½ target frequency) with the phases of the system clock signals HCK and HCKB.

Subsequently, the controller 12 may provide the data clock signals WCK and WCKB with the target frequency in the main section to the semiconductor apparatus 22, and the semiconductor apparatus 22 may match the phases of the plurality of multiphase divided signals ICK, QCK, ICKB, and QCKB that are generated based on the data clock signals WCK and WCKB with the target frequency with the phases of the system clock signals HCK and HCKB. Accordingly, the controller 12 may stably maintain the phase matching state between the plurality of multiphase divided signals ICK, QCK, ICKB, and QCKB that are generated in the semiconductor apparatus 22 according to the data clock signals WCK and WCKB and the system clock signals HCK and HCKB.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A clock signal processing circuit comprising:
   a clock buffer configured to generate a pair of second clock signals with opposite phases after receiving a pair of first clock signals with opposite phases and configured to fix the second clock signals to determined levels according to a control signal until toggling of the first clock signals begins.

2. The clock signal processing circuit of claim 1, further comprising a division circuit configured to generate third clock signals by dividing the second clock signals when the toggling of the first clock signals begins.

3. The clock signal processing circuit of claim 1, wherein the clock buffer includes:
   a first current path circuit configured to generate any one of the second clock signals based on any one of the first clock signals;
   a second current path circuit configured to generate the other one of the second clock signals based on the other one of the first clock signals; and
   an equalization circuit configured to fix the second clock signals to the determined levels by equalizing a first current path of the first current path circuit and a second current path of the second current path circuit according to the control signal until the toggling of the first clock signals begins.

4. The clock signal processing circuit of claim 1, further comprising a control circuit configured to generate the control signal based on at least one of a self-refresh exit command, a clock training entry command, and a clock training exit command, and any one of the first clock signals.

5. The clock signal processing circuit of claim 4, wherein the control circuit includes a latch configured to allow the control signal to be transited to a first level based on the at least one of the self-refresh exit command and the clock training entry command and configured to allow the control signal to be transited to a second level based on the any one of the first clock signals.

6. The clock signal processing circuit of claim 1, further comprising a control circuit configured to generate the control signal based on at least one of the self-refresh exit command and the clock training entry command and any one of the second clock signals.

7. The clock signal processing circuit of claim 6, wherein the control circuit includes:
   a first switch coupled between a power supply terminal and a connection node and controlled based on a first preliminary control signal;
   a second switch coupled between the connection node and a ground terminal and controlled based on a second preliminary control signal;
   a logic gate configured to generate the second preliminary control signal based on an inverted first preliminary control signal and one of the second clock signals;
   a comparator configured to compare a voltage level of a first input terminal that is coupled to the connection node and a reference voltage that is input to a second input terminal and configured to output a comparison result to the control signal; and
   a capacitor coupled between the first input terminal of the comparator and the ground terminal.

8. The clock signal processing circuit of claim 7, wherein the first preliminary control signal is generated based on the at least one of the self-refresh exit command and the clock training entry command.

9. A semiconductor apparatus comprising:
   a training circuit configured to perform a clock training operation only once in an initial power-up process and configured to refrain from performing the clock training operation with respect to a self-refresh exit command and a clock training entry command after the initial power-up process; and
   a clock signal processing circuit configured to perform a clock buffer control operation that controls an output of a clock buffer, which receives a data clock signal, according to at least one of the self-refresh exit command and the clock training entry command.

10. The semiconductor apparatus of claim 9, wherein the clock training operation includes an operation that matches phases of the data clock signal and a system clock signal, which are provided from outside of the semiconductor apparatus.

11. The semiconductor apparatus of claim 9, wherein the clock buffer control operation includes an operation that fixes the output of the clock buffer to a determined level until toggling of the data clock signal that is provided from outside of the semiconductor apparatus begins.

12. The semiconductor apparatus of claim 9, wherein the clock signal processing circuit includes:
   a clock buffer configured to generate a pair of output signals with opposite phases after receiving a pair of data clock signals with opposite phases and configured to fix the output signals to determined levels according to a control signal until toggling of the data clock signals begins; and
   a division circuit configured to generate multiphase divided signals by dividing the output signals of the clock buffer.

13. The semiconductor apparatus of claim 12, wherein the clock buffer includes:
   a first current path circuit configured to generate any one of the output signals based on any one of the data clock signals;
   a second current path circuit configured to generate the other one of the output signals based on the other one of the data clock signals; and
   an equalization circuit configured to fix the output signals to the determined levels by equalizing a first current path of the first current path circuit and a second current path of the second current path circuit according to the control signal until the toggling of the data clock signals begins.

14. The semiconductor apparatus of claim 12, wherein the clock signal processing circuit further includes a control circuit configured to allow the control signal to be transited to a first level based on the at least one of the self-refresh exit command and the clock training entry command and configured to allow the control signal to be transited to a second level based on one of the data clock signals.

15. The semiconductor apparatus of claim 12, wherein the clock signal processing circuit further includes a control circuit configured to generate the control signal according to the at least one of the self-refresh exit command and the clock training entry command, and one of the pair of output signals.

16. A semiconductor system comprising:
a semiconductor apparatus configured to perform a clock training operation only once in an initial power-up process, and perform a clock buffer control operation that controls an output of a clock buffer that is configured to receive a data clock signal according to at least one of a self-refresh exit command and a clock training entry command, other than performing the clock training operation with respect to the self-refresh exit command and the clock training entry command after the initial power-up process; and
a controller configured to provide at least one of a system clock signal, the data clock signal, the self-refresh exit command, and the clock training entry command to the semiconductor apparatus and provide the data clock signal with different frequencies in a preliminary section and a main section to the semiconductor apparatus, wherein the controller provides the data clock signal with a lower frequency in the preliminary section than a target frequency of the main section.

17. The semiconductor system of claim 16, wherein the clock training operation includes an operation that matches phases of the data clock signal and the system clock signal.

18. The semiconductor system of claim 16, wherein the clock buffer control operation includes an operation that fixes the output of the clock buffer to a determined level until toggling of the data clock signal begins.

19. The semiconductor system of claim 16, wherein the semiconductor apparatus includes:
the clock buffer configured to generate a pair of output signals with opposite phases after receiving a pair of data clock signals with opposite phases and configured to fix the output signals to determined levels according to a control signal until toggling of the data clock signals begins; and
a division circuit configured to generate multiphase divided signals by dividing the output signals of the clock buffer.

20. The semiconductor system of claim 19, wherein the clock buffer includes:
a first current path circuit configured to generate any one of the output signals based on any one of the data clock signals;
a second current path circuit configured to generate the other one of the output signals based on the other one of the data clock signals; and
an equalization circuit configured to fix the output signals to the determined levels by equalizing a first current path of the first current path circuit and a second current path of the second current path circuit according to the control signal until the toggling of the data clock signals begins.

21. The semiconductor system of claim 19, wherein the semiconductor apparatus further includes a control circuit configured to allow the control signal to be transited to a first level based on the at least one of the self-refresh exit command and the clock training entry command and allow the control signal to be transited to a second level based on one of the data clock signals.

22. The semiconductor system of claim 19, wherein the semiconductor apparatus further includes a control circuit configured to generate the control signal according to the at least one of the self-refresh exit command and the clock training entry command, and one of the pair of output signals.

* * * * *